(12) United States Patent
Li et al.

(10) Patent No.: US 7,352,155 B2
(45) Date of Patent: Apr. 1, 2008

(54) APPARATUS AND METHOD FOR DETECTING BATTERY PACK VOLTAGE

(75) Inventors: Guoxing Li, Sunnyvale, CA (US); Wei Wang, Shanghai (CN)

(73) Assignee: O2Micro International Ltd. (KY)

( * ) Notice: Subject to any disclaimer, the term of this patent is extended or adjusted under 35 U.S.C. 154(b) by 0 days.

(21) Appl. No.: 11/451,124

(22) Filed: Jun. 12, 2006

(65) Prior Publication Data

US 2007/0285054 A1    Dec. 13, 2007

(51) Int. Cl.
*H02J 7/00* (2006.01)
(52) U.S. Cl. .................. 320/118; 320/116; 320/120; 320/122; 320/132; 320/134; 320/136
(58) Field of Classification Search ............ 320/116, 320/132, 118, 120, 122, 134, 136
See application file for complete search history.

(56) References Cited

U.S. PATENT DOCUMENTS

| | | | | |
|---|---|---|---|---|
| 5,206,578 A | * | 4/1993 | Nor | 320/118 |
| 5,932,932 A | * | 8/1999 | Agatsuma et al. | 307/10.6 |
| 6,236,215 B1 | * | 5/2001 | Kanehira | 324/429 |
| 6,281,684 B1 | * | 8/2001 | James | 324/434 |
| 6,362,626 B2 | * | 3/2002 | Furukawa | 324/429 |
| 6,459,236 B2 | * | 10/2002 | Kawashima | 320/118 |
| 6,462,510 B1 | * | 10/2002 | Takada et al. | 320/116 |
| 6,930,467 B2 | * | 8/2005 | Suzuki | 320/134 |
| 7,248,020 B2 | * | 7/2007 | Hidaka et al. | 320/134 |
| 2006/0103351 A1 | * | 5/2006 | Tanigawa et al. | 320/118 |

* cited by examiner

*Primary Examiner*—Jeffrey Sterrett
*Assistant Examiner*—Stuart Hansen
(74) *Attorney, Agent, or Firm*—Li K. Wang; Wang Law Firm, Inc.

(57) ABSTRACT

An apparatus and method for detecting battery pack voltage is disclosed. The voltage detection apparatus includes a plurality of selectors for providing a cell voltage of a predetermined cell, a detector buffer for receiving the cell voltage of the predetermined cell and supplying an intermediate voltage, a data process circuit for processing the intermediate voltage to acquire a voltage value indicative of the cell voltage of the predetermined cell, wherein each selector includes a plurality of switches and a plurality of level shifters, each switch being controlled by one of the plurality of level shifters to operate with a safe gate-source voltage, source-bulk voltage and reverse-biased body diode.

22 Claims, 6 Drawing Sheets

APPARATUS AND METHOD FOR DETECTING BATTERY PACK VOLTAGE

FIELD OF THE INVENTION

The present invention relates to voltage detection and in particular to an apparatus and method for detecting the voltage of a battery pack.

BACKGROUND OF THE INVENTION

A battery pack is usually composed of a plurality of cells connected in series for supplying electric power to electronic equipments such as an electronic vehicle, portable computer, electronic camera or the like. The battery pack is usually equipped with a voltage detection apparatus that detects the voltage of each cell for capacity calculation and protection of each cell.

Figure 1:
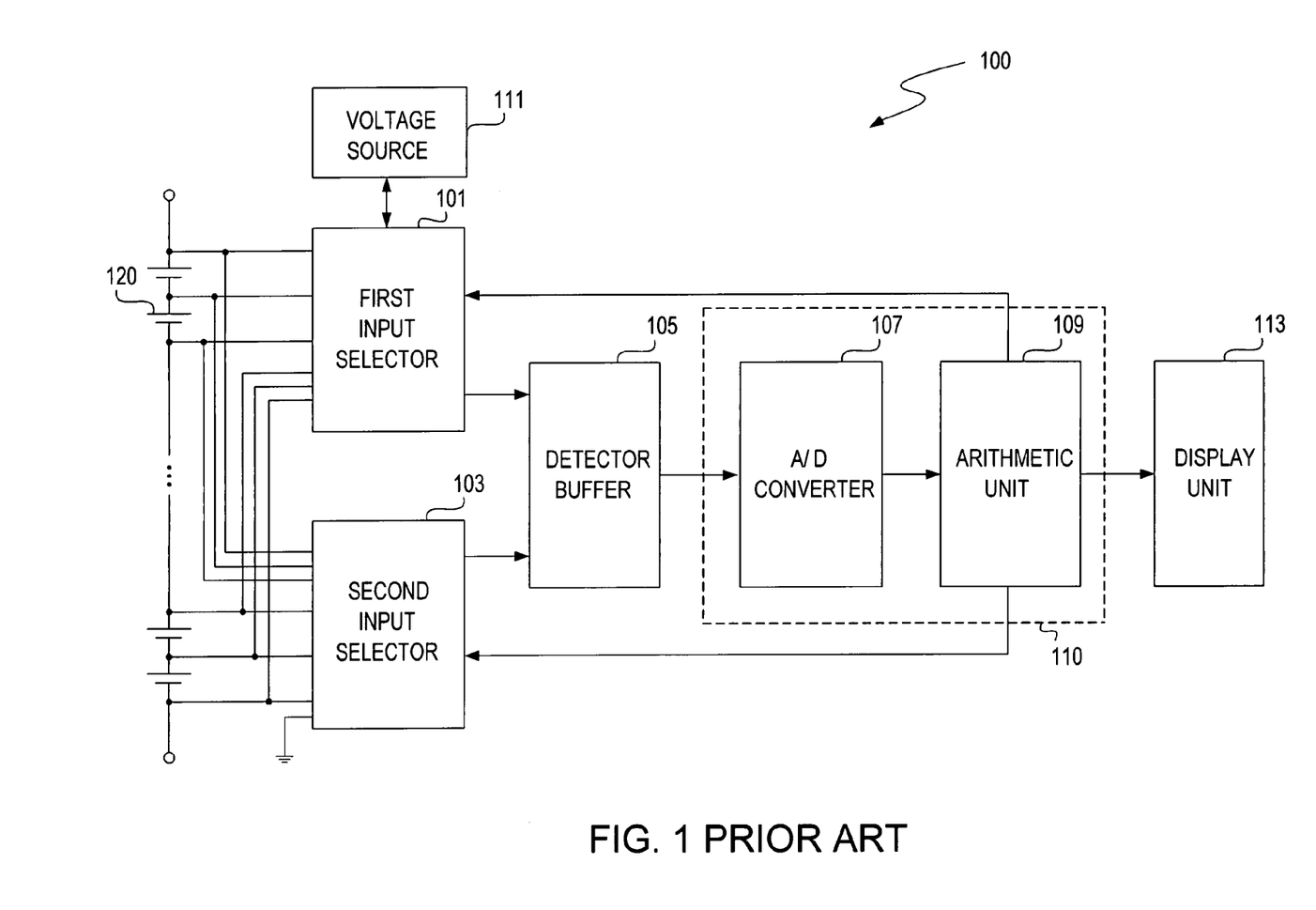
FIG. 1 is a prior art voltage detection apparatus.

FIG. 1 illustrates a prior art voltage detection apparatus 100 for a battery pack in which a plurality of cells are connected in series. The cell voltage detection apparatus 100 is composed of a first input selector 101, a second input selector 103, a detector buffer 105, a data process circuit 110, and a voltage source 111. Generally, an external display unit 113 is connected to the voltage detection apparatus 100 to receive and display the measured cell voltage.

To detect the voltage of each cell in the battery pack, for example, a cell 120, the first input selector 101 selects the positive electrode of the cell 120 and the second input selector 103 selects the negative electrode of the cell 120. Through the first input selector 101 and the second input selector 103, the voltage of the cell 120 is supplied to the detector buffer 105. In the detector buffer 105, the voltage of the cell 120 is subjected to a predetermined calculation to provide an intermediate voltage to the data process circuit 110. The data process circuit 110 processes the intermediate voltage to obtain a voltage value indicative of the cell voltage of the cell 120. The data process circuit 110 may include an analog to digital (A/D) converter 107 and an arithmetic unit 109 as shown in FIG.1 or simply includes a plurality of comparators to determine the voltage value. In FIG.1, the A/D converter 107 converts the intermediate voltage from analog to digital and provides a digital value of the intermediate voltage to the arithmetic unit 109. The arithmetic unit 109 such as a microprocessor processes the supplied digital value in a predetermined manner to acquire the voltage value indicative of the cell voltage of the cell 120. Finally, the display unit 113 can indicate the voltage value on a display screen such as a LCD display panel, plasma display panel, cathode-ray tube (CRT), a fluorescent character display tube or the like.

However, the first and second input selectors 101 and 103 are usually composed of semiconductor switching elements produced using conventional high-voltage complementary metal oxide semiconductor (CMOS) process. Such switching elements impose limitation on application of the voltage detection apparatus 100. The limitation is caused by the fact that the more cells connected in series in the battery pack, the higher break-down voltage required for the switching elements in the first and second input selectors 101 and 103, while such switching elements have a low break-down voltage. Hence taking into account of the low break-down voltage of the switching elements, there has to be a limitation on the cell number to ensure the proper operation of the switching elements. Specially, when the switching elements are constructed of MOSFETs, to ensure the MOSFETs in normal operation, the gate-source voltage of each MOSFET should be always within the safety range, further, the source-bulk voltage of each MOSFET should also be always within the safety range and the body diode of each MOSFET should always be reverse-biased.

With respect to the switching elements that have a high break-down voltage, there may not be such limitation as previously stated. However, the switching elements with the high break-down voltage have to be produced using a more complicated and expensive CMOS process. Consequently, the overall cost of the voltage detection apparatus 100 is increased. Furthermore, compared with the switching elements with the low break-down voltage, the die size of the switching elements with the high break-down voltage usually has to increase a lot to meet the same turn-on resistance requirement, which also imposes an increased cost to the voltage detection apparatus 100. Hence, taking into account of the increased cost and die size, it is not an ideal solution to adopt the switching elements produced using the more complicated and expensive CMOS process to overcome the aforementioned drawbacks.

Accuracy is another aspect that should be taken into account when evaluating a voltage detection apparatus. Typically, inaccuracy is caused by some elements in the voltage detection apparatus. Fox example, in the exemplary voltage detection apparatus 100, a common mode error usually exists in the detector buffer 105 and can degrade the accuracy of the voltage detection. To enhance the accuracy, a common way is to add some supplementary elements or lines, but this will inevitably complicate the circuitry.

It is therefore an object of the present invention to provide a voltage detection apparatus and method that can be realized using the switching elements produced using the high-voltage CMOS process, and at the same time no cost burden is induced and the accuracy is enhanced without complicating the circuitry. It is to such a voltage detection apparatus and method that the present invention is primarily directed.

SUMMARY OF THE INVENTION

In one embodiment, there is provided a voltage detection apparatus for a battery pack that has a plurality of battery blocks and each battery block includes a plurality of cells connected in series. The voltage detection apparatus includes a plurality of selectors, a detector buffer and a data process unit, each selector being coupled to one of the plurality of battery blocks for determining a predetermined cell and receiving a first voltage signal and a second voltage signal from the coupled battery block, the detector buffer being coupled to the plurality of selectors for receiving a cell voltage of the predetermined cell and supplying an intermediate voltage, and the data process circuit being coupled to the detector buffer for processing the intermediate voltage to acquire a voltage value indicative of the cell voltage of the predetermined cell.

In another embodiment, there is provided a method for detecting a voltage of each cell in a battery pack that has a plurality of cells connected in series. The method includes the steps of generating a plurality of control signals, each control signal having an adjustable magnitude, selecting a predetermined cell under control of the plurality of control signals, the predetermined cell having a cell voltage, acquiring an intermediate voltage based on the cell voltage of the predetermined cell, and acquiring a voltage value indicative of the cell voltage of the predetermined cell according to the intermediate voltage.

In yet another embodiment, there is provided an electronic system. The electronic system includes a battery pack having a plurality of cells connected in series, the plurality of battery cells being divided into a plurality of battery blocks, an electronic equipment attached to and powered up by the battery pack, a digital device capable of predetermining a cell from the plurality of cells and providing selection signals, and a voltage detection apparatus being coupled to the digital device for receiving the selection signals and being coupled to the battery pack for selecting the predetermined cell according to the selection signals and detecting a voltage of the predetermined cell, the voltage detection apparatus further including a plurality of switch boxes and a plurality of switch controllers, each switch box being coupled to one of the plurality of battery blocks, and each switch controller being coupled to one of the plurality of battery blocks for receiving voltage signals and to one of the plurality of switch boxes for supplying control signals.

BRIEF DESCRIPTION OF THE DRAWINGS

Advantages of the present invention will be apparent from the following detailed description of exemplary embodiments thereof, which description should be considered in conjunction with the accompanying drawings, in which.

DETAILED DESCRIPTION OF THE INVENTION

Reference will now be made in detail to embodiments of the present invention. While the invention will be described in conjunction with the embodiments, it will be understood that they are not intended to limit the invention to these embodiments. On the contrary, the invention is intended to cover alternatives, modifications and equivalents, which may be included within the spirit and scope of the invention as defined by the appended claims.

Figure 2:
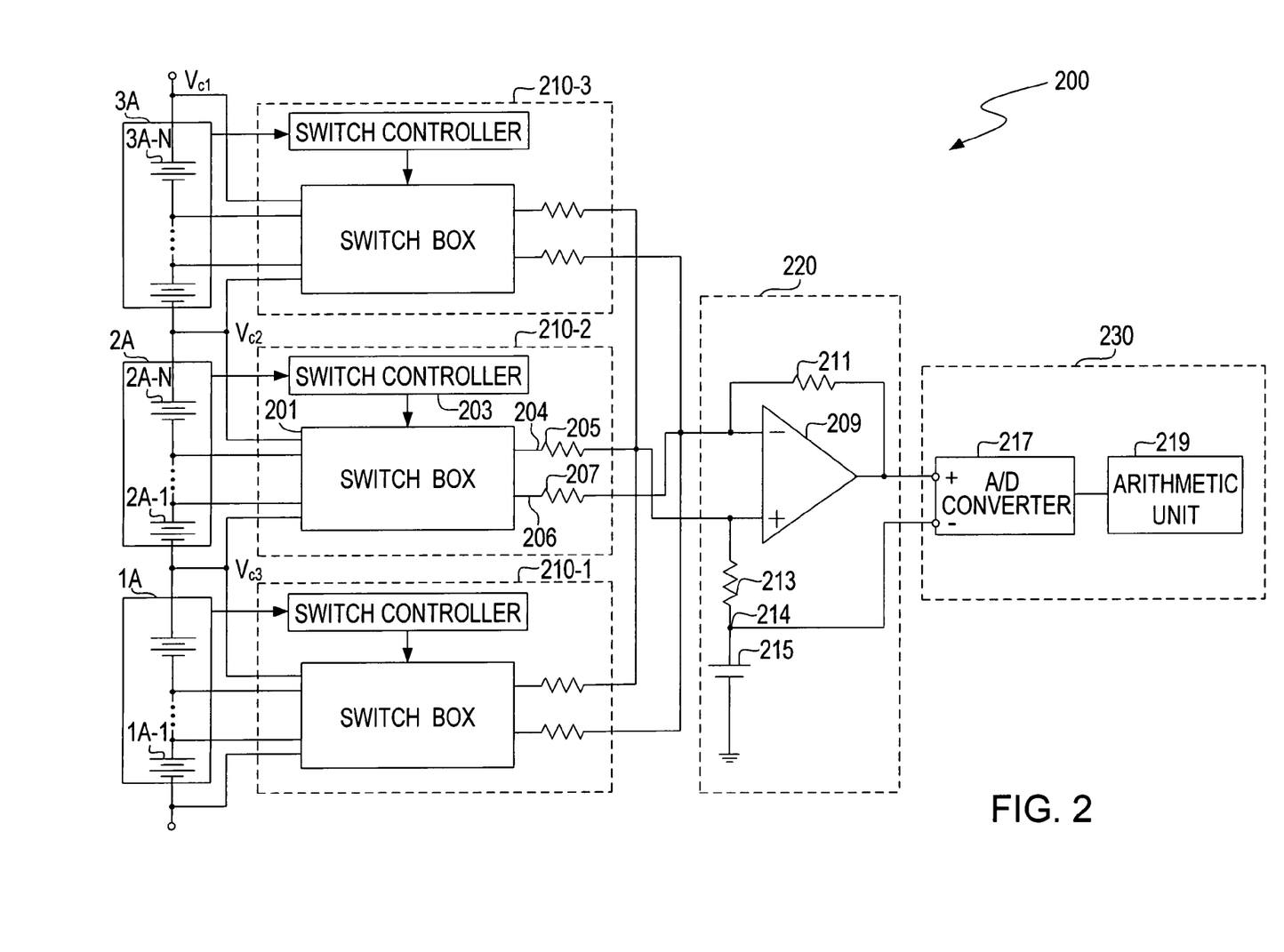
FIG. 2 is a block diagram of a voltage detection apparatus in accordance with one embodiment of the present invention.

FIG. 2 illustrates a voltage detection apparatus 200 according to one embodiment of the present invention. The voltage detection apparatus 200 includes a plurality of selectors 210, a detector buffer 220 and a data process circuit 230 that includes an A/D converter 217 and an arithmetic unit 219. The voltage detection apparatus 200 detects the cell voltage of cells 1A-1 to 3A-N that are coupled in series. Referring to the cell connection in FIG.2, the cell 1A-1 has a lowest voltage potential, while the cell 3A-N has a highest voltage potential Vc1.

The cells 1A-1 to 3A-N are divided into a plurality of battery blocks, for example, three battery blocks 1A, 2A and 3A. Each battery block is coupled to one of the plurality of selectors. As shown in FIG. 2, the battery block 1A is coupled to a selector 210-1, the battery block 2A is coupled to a selector 210-2 and the battery block 3A is coupled to a selector 210-3. Each selector has similar circuitry and electrical feature, therefore the selector 210-2 as a representative is depicted in details hereinafter.

The selector 210-2 includes a switch box 201, a switch controller 203, a first resistor 205 and a second resistor 207. The switch box 201 is connected to the battery block 2A for selecting a predetermined cell from cells 2A-1 to 2A-N. The switch controller 203 is connected to the switch box 201 for controlling a status of the switch box 201, and the switch controller 203 is further connected to the battery block 2A for receiving voltage signals. When the predetermined cell is selected, the voltages at the positive and negative electrodes of the predetermined cell are respectively passed to lines 204 and 206 through the switch box 201. The voltages are then provided to the detector buffer 220. In other words, the cell voltage of the predetermined cell is provided to the detector buffer 220.

The detector buffer 220 includes an operational amplifier 209, a third resistor 211, a fourth resistor 213 and a reference voltage 215. The voltage on line 204 is provided to the non-inverting terminal of the operational amplifier 209 through the first resistor 205. The voltage on the line 206 is provided to the inverting terminal of the operational amplifier 209 through the second resistor 207. The third resistor 211 is connected between the inverting terminal and the output terminal of the operational amplifier 209. The non-inverting terminal is further connected to the ground through the fourth resistor 213 and the reference voltage 215, and the juncture node of the fourth resistor 213 and the reference voltage 215 is designated with a reference number 214 as shown in FIG. 2. The reference voltage 215 is capable of providing a direct current (DC) voltage Vref, so that the voltage at the juncture node 214 is steadily tied at Vref.

The detector buffer 220 receives the cell voltage of the predetermined cell and outputs an intermediate voltage at the output terminal. Assuming the resistances of the first and second resistors 205 and 207 are equal, and the resistances of the third and fourth resistors 211 and 213 are equal, the intermediate voltage can be theoretically calculated according to equation (1)

$$V_{out} = \frac{R_c \cdot V_{cell}}{R_a} + V_{ref} \qquad (1)$$

where, Vcell is defined as the cell voltage of the predetermined cell, Vout is defined as the intermediate voltage, Rc is defined as the resistance of the third resistor 211 or the fourth resistor 213, and Ra is defined as the resistance of the first resistor 205 or the second resistor 207. Assuming the ratio between Ra and Rc is 2, then the intermediate voltage Vout can be calculated according to equation (2)

$$V_{out} = \frac{V_{cell}}{2} + V_{ref} \qquad (2)$$

Then the intermediate voltage Vout is provided to the A/D converter 217. Meanwhile, the DC reference voltage Vref is also provided to the A/D converter 217. The intermediate voltage Vout and the DC reference voltage Vref form a pair of difference inputs V(Vout, Vref) and are respectively received by the non-inverting terminal and inverting terminal of the A/D converter 217. The A/D converter 217 converts the intermediate voltage Vout from analog to digital and provides the digital value of the intermediate voltage to the arithmetic unit 219. The DC reference voltage Vref is employed for calibrating the A/D converter 217. The arithmetic unit 219 then processes the digital value in a predetermined manner to acquire a voltage value indicative of the voltage of the predetermined cell.

Figure 3:
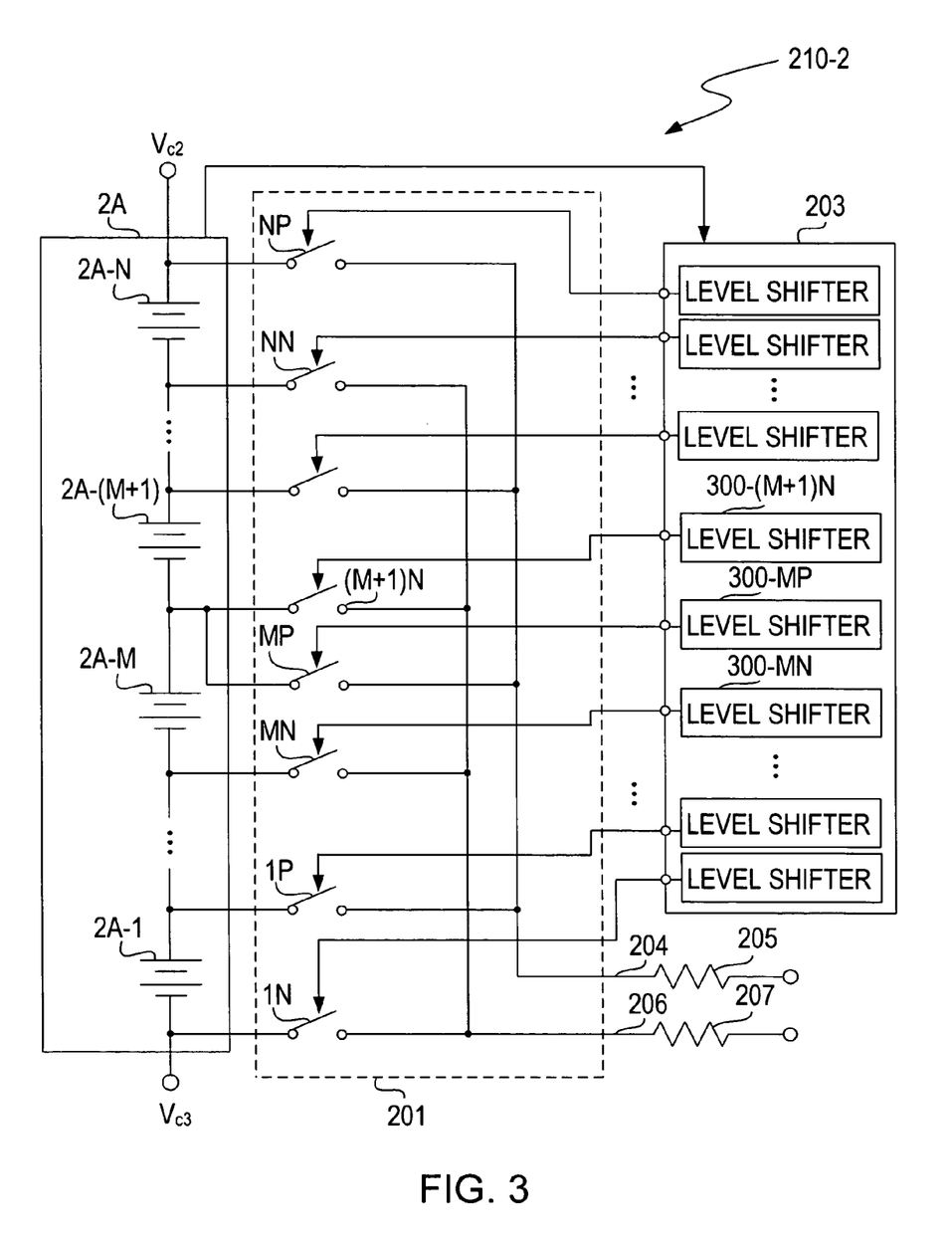
FIG. 3 is a schematic diagram of one selector in FIG. 2.

FIG. 3 illustrates a schematic diagram of the selector 210-2 in FIG. 2 according to one embodiment. As shown in FIG. 3, the switch box 201 includes a plurality of switches and the switch controller 203 includes a plurality of level shifters. Each cell from cell 2A-1 to cell 2A-N in the battery block 2A is allocated two switches respectively connected to the positive and negative electrodes of the cell. Each switch has a first terminal, a second terminal and a control terminal. The first terminal of each odd-numbered switch is connected to the positive electrode of the connected cell, wherein the odd-numbered switches are respectively designated with reference symbols 1P to NP. The first terminal of each even-numbered switch is connected to the negative electrode of the connected cell, wherein the even-numbered switches are respectively designated with reference symbols 1N to NN. The second terminal of each odd-numbered switch is connected together to the first resistor 205 through line 204. The second terminal of each even-numbered switch is connected together to the second resistor 207 through line 206. The control terminal of each switch is connected to one of the level shifters for receiving a control signal and a status of each switch is determined by the received control signal.

Further, if a switch in the switch box 201 is constructed of a P-channel MOSFET (PMOS), to ensure that the source-bulk voltage of the PMOS switch is within the safety range and the PMOS body diode is always reverse-biased, the bulk of the PMOS switch should be connected to the local highest voltage potential Vc2 herein. If a switch in the switch box is constructed of an N-channel MOSFET (NMOS), usually, the bulk of the NMOS switch should be connected to the global ground. For the selector 210-1 in FIG. 2, the local highest voltage potential is Vc3, and for the selector 210-3 in FIG. 2, the local highest voltage potential is Vc1.

Figure 4:
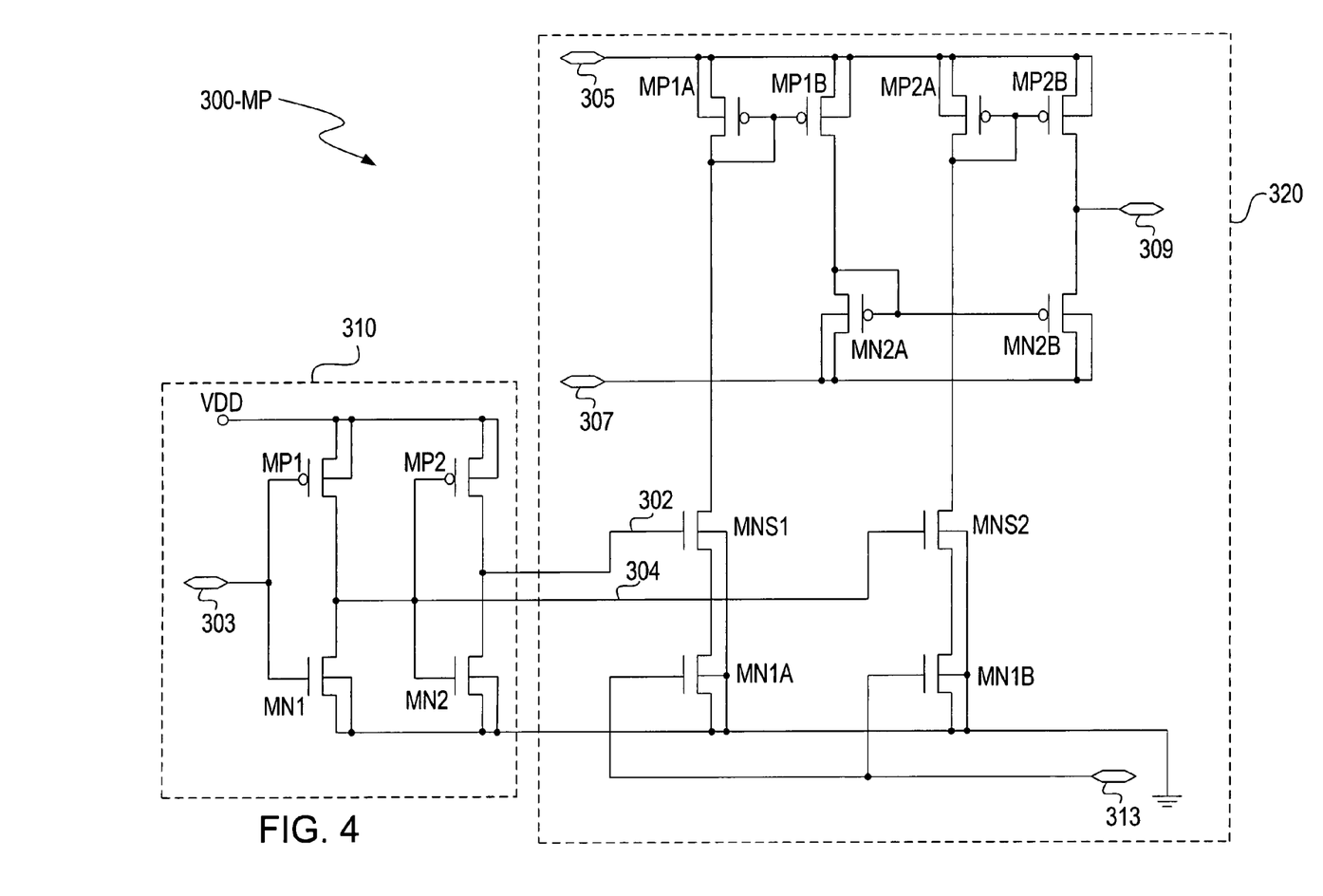
FIG. 4 is a schematic diagram of one level shifter of FIG. 3.

FIG. 4 illustrates an exemplary schematic diagram of a level shifter 300-MP in FIG. 3. The exemplary level shifter 300-MP includes a control unit 310 and a signal generator 320. Powered by a power source VDD, the control unit 310 receives a selection signal from a digital device (not shown in FIG. 4) at a selection terminal 303. The selection signal is typically a digital signal, either value 0 representative of a low voltage level or value 1 representative of a high voltage level. When the selection terminal 303 is provided the value 1, the voltage on line 302 will be set high while the voltage on line 304 will be set low. Similarly, when the selection terminal 303 is provided the value 0, the voltage on line 302 will be set low while the voltage on line 304 will be set high. In FIG. 4, the control unit 310 is realized by a first inverter element and a second inverter element. The first inverter element is connected between the selection terminal 303 and line 304, and formed by metal oxide semiconductor field effect transistors (MOSFETs) MP1 and MN1. The second inverter element is connected between line 304 and line 302 and formed by the MOSFETs MP2 and MN2. However, it should be understood by the skilled in the art that the control unit can be realized by other conventional circuitries, and the control unit 310 shown in FIG. 3 is for the purpose of illustration and not of limitation.

The signal generator 320 includes a first current mirror formed by MOSFETs MP1A and MP1B, a second current mirror formed by MOSFETs MP2A and MP2B, a third current mirror formed by MOSFETs MN2A and MN2B, a first switch MNS1, a second switch MNS2, a first current source MN1A and a second current source MN1B. Generally, the switches and current sources are constructed of MOSFETs as shown in FIG. 4, but it should be understood that the MOSFET structure can be replaced by other circuitries as long as the necessitated functionality is realized.

The gate terminal of the first switch MNS1 receives the voltage on line 302 and the gate terminal of the second switch MNS2 receives the voltage on line 304. The source terminal of the first switch MNS1 is connected to the first current source MN1A and the drain terminal of the first switch MNS1 is connected to the first current mirror. The source terminal of the second switch MNS2 is connected to the second current source MN1B and the drain terminal of the second switch MNS2 is connected to the second current mirror.

The first and second current mirrors are connected to the battery block 2A shown in FIG. 3 at a power terminal 305. At the power terminal 305, a first voltage signal from the battery block 2A is received. The first voltage signal supplies electrical power to the level shifter 300-MP. For all the level shifters in the selector 210-2, the power terminal is connected to the positive electrode of the cell 2A-N that has the highest voltage potential Vc2. The first voltage signal has a voltage level equal to Vc2. The third current mirror is connected to the first current mirror for copying the current flowing through the first current mirror. The third current mirror is also connected to the battery block 2A for receiving a second voltage signal at a level terminal 307. For the level shifter 300-MP, supposing the level terminal 307 is connected to the positive electrode of a test cell that has a voltage potential a*Vcell1 at the positive electrode, wherein Vcell1 is defined as a standard voltage of a battery cell, then the second voltage signal has a voltage level equal to a*Vcell1. The third current mirror is also connected to the second current mirror at an output terminal 309 through which the control signal is provided to the connected switch MP in FIG. 3 to determine the status of the connected switch MP. The magnitude of the control signal is determined by the first voltage signal and the second voltage signal.

The first and second current sources MN1A and MN1B are further connected to a current terminal 313 through which a current control signal is received. The current control signal controls a static current of the level shifter 300-MP.

When the value 1 is provided to the selection terminal 303, as previously mentioned, the voltage on line 302 is set to be high while the voltage on line 304 is set to be low. Consequently, the first switch MNS1 is turned on and the second switch MNS2 is turned off. The static current from the first current source MN1A flows into the MOSFET MP1A through the first switch MNS1. Then copied sequentially by the first and third current mirrors, the static current is finally passed to the MOSFET MN2B. Since the MOSFET MN2B is conductive, the voltage at the output terminal 309 is pushed down to the voltage at the level terminal 307 that is a*Vcell1. As shown in FIG. 2, the level shifter 300-MP is connected to the control terminal of the switch MP that is generally constructed of MOSFETs. Supposing the switch MP is a PMOS, it can be regarded that the output terminal 309 is connected to the gate terminal of the switch MP and the source terminal of the switch MP is connected to the positive electrode of the cell 2A-M where the voltage potential is defined as m*Vcell1. So, when the value 1 is provided to the selection terminal 303, the gate-source voltage of the switch MP is calculated according to equation (3)

$$Vgs(m)=(a-m)*Vcell1 \qquad (3)$$

where the gate-source voltage of the switch MP is defined as Vgs(m). With the gate-source voltage computed according to the equation (3), the switch MP is turned on, and therefore the positive electrode of the cell 2A-M is selected.

When the value 0 is provided to the selection terminal 303, as previously mentioned, the voltage on line 302 is set to be low while the voltage on line 304 is set to be high. Consequently, the first switch MNS1 is switched off and the second switch MNS2 is switched on. The static current from the second current source MN1B flows into the MOSFET MP2A through the second switch MNS2. Then the static current is copied to the MOSFET MP2B by the second current mirror. Since the MOSFET MP2B is conductive, the voltage at the output terminal 309 is pushed up to the voltage at the power terminal 305 that is equal to Vc2. Similarly, supposing the switch MP is a PMOS, it can be concluded that when the value 0 is provided to the selection terminal 303, the gate-source voltage of the switch MP is calculated according to equation (4)

$$Vgs(m)=Vc2-m*Vcells \qquad (4)$$

With the gate-source voltage computed according to the equation 4), the switch MP is turned off, and therefore the positive electrode of the cell 2A-M is isolated.

For the switch MP, it is easy to acquire a gate-source voltage within the safety range through setting a proper "a*Vcell1" in the equation 3). In other words, through connecting the level terminal 307 to a proper voltage potential in the battery block 2A, the gate-source voltage is guaranteed to be within the safety range. With respect to the equation 4), the gate-source voltage is steadily within the safety range. Since the gate-source voltage of the switch MP can be regulated to be always within the safety range, the low gate-source break-down voltage of the switch produced with the conventional high-voltage CMOS process will not impose limitation on applications of the voltage detection apparatus. Similarly, for other switches in the selectors 210-1, 210-2 and 210-3, equations similar to 3) and 4) can de deduced. Further, hereinbefore, the equations 3) and 4) are deduced on the assumption that the switch MP is a PMOS. However, it should be understood by the skilled in the art that an NMOS can also be adopted and the equations concerning calculation of the gate-source voltage can be similarly deduced thereof.

It should be understood that there are other kinds of level shifts that can realize the same functionality. The disclosed embodiment of the level shifter herein is for the purpose of illustration and not of limitation.

Figure 5:
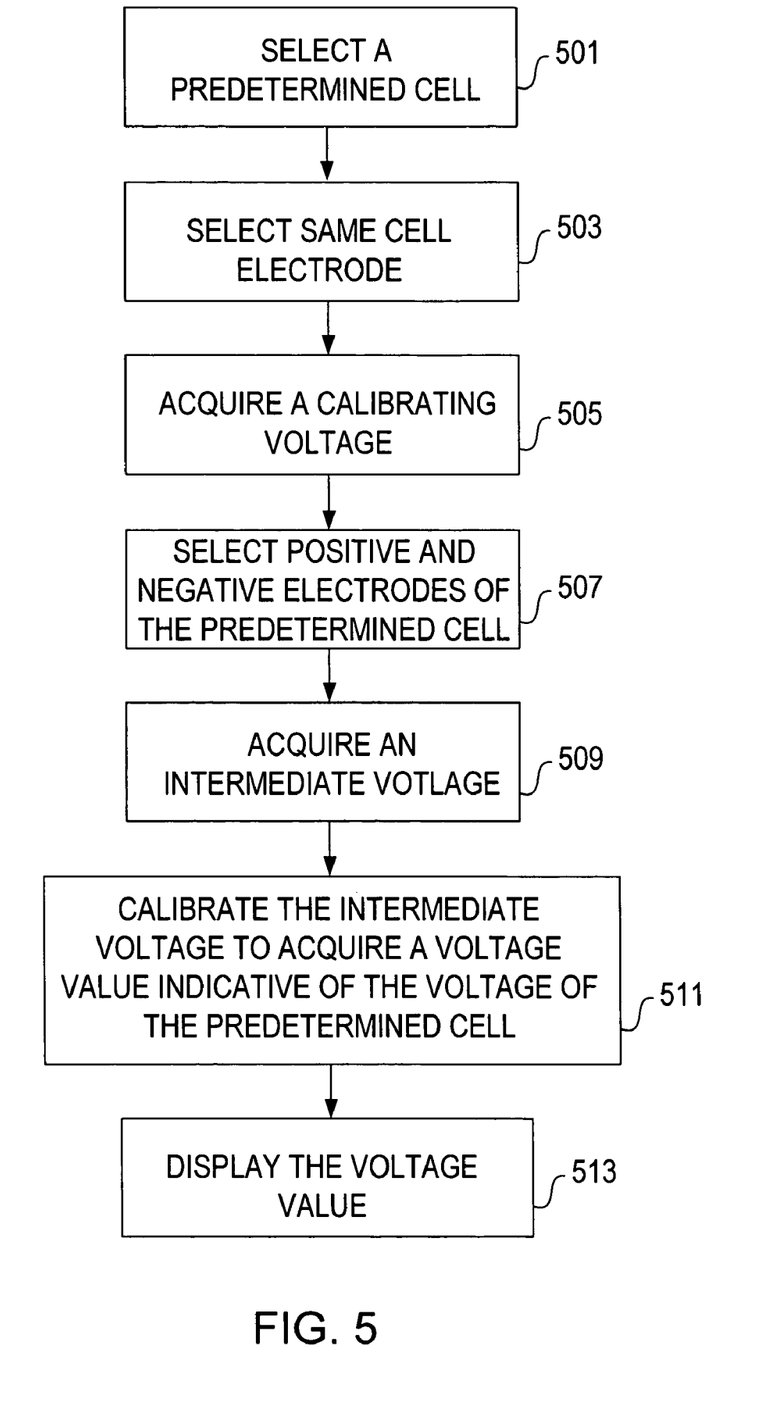
FIG. 5 is a flow chart illustrating operation of the cell voltage detection apparatus of FIG. 2.

FIG. 5 illustrates a flow chart of the cell voltage detection according to one embodiment of the present invention. It will be described hereinafter how the voltage detection apparatus 200 detects the cell voltage of the cells 1A-1 to 3A-N.

Firstly, in step 501, a predetermined cell is selected by the digital device and the voltage of the predetermined cell will be detected in the following steps. The predetermined cell is supposed to be the cell 2A-M herein for the purpose of description.

Then, steps 503 and 505 aim to acquire a calibrating voltage for eliminating the common mode error in the detector buffer 220. As acknowledged by the skilled in the art, accuracy of the operational amplifier 209 is impaired by the common mode error and accuracy of the voltage detection apparatus 200 is consequently degraded. To enhance the accuracy, it is necessitated to eliminate the common mode error from the output of the operational amplifier 209.

In step 503, a common mode voltage is selected when the switches MP and (M+1)N are switched on respectively under control of the level shifters 300-MP and 300-(M+1)N. Herein the switch (M+1)N is connected to the negative electrode of the cell 2A-(M+1) which is neighboring to the cell 2A-M. In this way, the voltage at the positive electrode of the cell 2A-M is provided to the non-inverting terminal of the operational amplifier 209 sequentially through the switch MP, line 204 and the first resistor 205. Meanwhile, as shown in FIG. 3, the voltage at the positive electrode of the cell 2A-M or the negative electrode of the cell 2A-(M+1) is also provided to the inverting terminal of the operational amplifier 209 sequentially through the switch (M+1)N, line 206 and the second resistor 207. In other words, the common mode voltage is provided to the operational amplifier 209 in the detector buffer 220. Similarly, the common mode voltage can also be acquired through delivering the voltage at the negative electrode of the cell 2A-M simultaneously to the non-inverting and inverting terminals of the operational amplifier 209. Then in step 505, when the operational amplifier 209 receives the common mode voltage, a calibrating voltage is outputted at the output terminal of the operational amplifier 209. The calibrating voltage indicates the common mode error at the output of the operational amplifier 209. The calibrating voltage is then received and processed by the data process unit 230.

After the calibrating voltage is acquired, the voltage detection apparatus 200 begins to detect the voltage of the predetermined cell 2A-M. In step 507, the cell voltage of the predetermined cell 2A-M is selected when the switches MP and MN are switched on respectively under control of the level shifters 300-MP and 300-MN. In this way, the voltage at the positive electrode of the cell 2A-M is provided to the non-inverting terminal of the operational amplifier 209 sequentially through the switch MP, line 204 and the first resistor 205. Meanwhile, the voltage at the negative electrode of the cell 2A-M is also provided to the inverting terminal of the operational amplifier 209 sequentially through the switch MN, line 206 and the second resistor 207. Then in step 509, according to the inputs at the non-inverting and inverting terminals, the operational amplifier 209 outputs an intermediate voltage at the output terminal. However, as previously stated, the intermediate voltage includes the common mode error. Step 511 is for eliminating the common mode error and obtains a voltage value indicative of the voltage of the predetermined cell 2A-M. After the intermediate voltage is received and processed by the data process unit 230, the voltage value is computed through subtracting the processed calibrating voltage from the processed intermediate voltage. After obtaining the voltage value, the display unit 113 finally displays the voltage value on the display screen.

Figure 6:
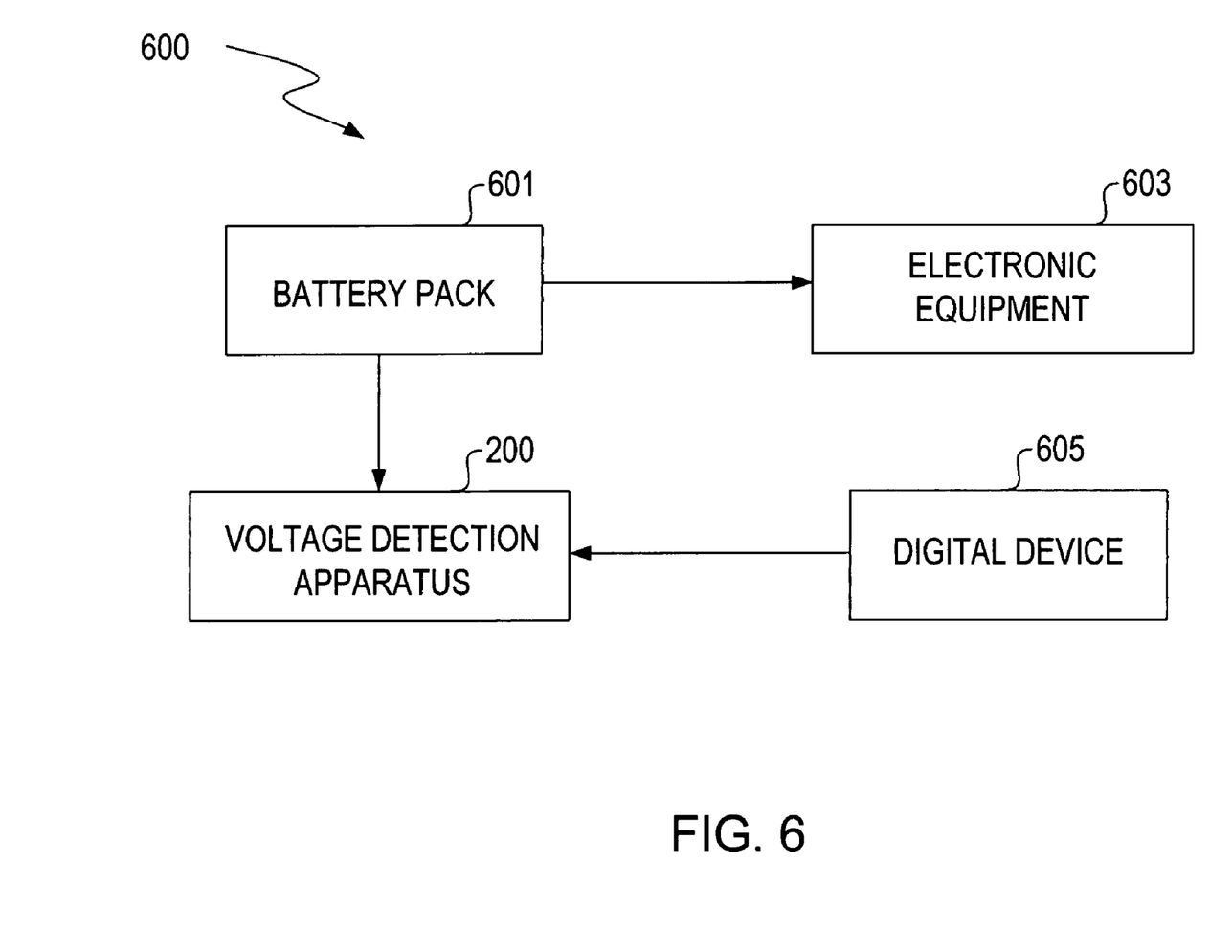
FIG. 6 is an electronic system in accordance with one embodiment of the present invention.

The aforementioned voltage detection apparatus can be applied to various electronic systems. FIG. 6 is an exemplary electronic system 600 that includes a battery pack 601, an electronic equipment 603, a voltage detection apparatus 200 and a digital device 605. The battery pack 601 is composed of a plurality of cells and is capable of providing an electrical power to the electronic equipment 603. The electronic equipment 603 can be an electronic vehicle, portable computer, electronic camera or the like. The battery pack 601 is further coupled to the voltage detection apparatus 200 that is capable of detecting the voltage of each cell in the battery pack 601. The digital device 605 is also connected to the voltage detection apparatus 200 for determining a predetermined cell that is to be detected. After the predetermined cell is determined, the digital device 605 can send selection signals to the voltage detection apparatus 200 and respond to the selection signals, the voltage detection apparatus 200 measures the cell voltage of the predetermined cell. According to the present invention, since that the gate-source voltage of each switch is guaranteed to be within the safety range under control of the level shifter, the switches in the voltage detection apparatus impose no limitation on application of the voltage detection apparatus.

In operation, the voltage detection apparatus 200 can detect a cell voltage of the cells 1A-1 to 3A-N used in a portable computer, electronic camera or the like. To detect the voltage of a predetermined cell, the cells 1A-1 to 3A-N are firstly divided into a plurality of battery blocks, for example the battery blocks 1A, 2A and 3A. Each battery block is connected to a selector for selecting the predetermined cell.

The selector includes a switch box and a switch controller. The switch controller receives voltage signals from the connected battery block and selection signals from a digital device. Based on the voltage signals and selection signals, the switch controller generates control signals with a predetermined magnitude. Under control of the control signals, the switch box selects the predetermined cell. Meanwhile, the predetermined magnitude of the control signals ensures the switch box in normal operation.

When the predetermined cell is selected, the selector provides the cell voltage of the predetermined cell to a detector buffer and a process unit to acquire a voltage value indicative of the cell voltage of the predetermined cell.

The terms and expressions which have been employed herein are used as terms of description and not of limitation, and there is no intention, in the use of such terms and expressions, of excluding any equivalents of the features shown and described (or portions thereof), and it is recognized that various modifications are possible within the scope of the claims. Other modifications, variations, and alternatives are also possible. Accordingly, the claims are intended to cover all such equivalents.

What is claimed is:

1. A voltage detection apparatus for a battery pack, the battery pack having a plurality of battery blocks, each battery block including a plurality of cells connected in series, each cell having a positive electrode and a negative electrode, the voltage detection apparatus comprising:
   a plurality of selectors, each selector being coupled to one of the plurality of battery blocks for determining a predetermined cell, each selector including a switch box and a switch controller, the switch controller being capable of receiving at least one voltage signal from the coupled battery block and controlling a status of the switch box;
   a detector buffer coupled to the plurality of selectors for receiving a cell voltage of the predetermined cell and supplying an intermediate voltage, the detector buffer having an inverting terminal and a non-inverting terminal; and
   a data process circuit coupled to the detector buffer for processing the intermediate voltage to acquire a voltage value indicative of the cell voltage of the predetermined cell.

2. The voltage detection apparatus of claim 1, wherein the switch box having a plurality of switches, each odd-numbered switch being coupled to the positive electrode of one of the plurality of cells in the coupled battery block, and each even-numbered switch being coupled to the negative electrode of one of the plurality of cells in the coupled battery block, and wherein the switch controller having a plurality of level shifters, each level shifter receiving the at least one voltage signal from the coupled battery block, and each level shifter being coupled to one of the plurality of switches for supplying a control signal to the coupled switch.

3. The voltage detection apparatus of claim 2, wherein the predetermined cell being selected when the odd-numbered and even-numbered switches respectively coupled to the positive and negative electrodes of the predetermined cell are turned on.

4. The voltage detection apparatus of claim 2, wherein each level shifter receiving a selection signal and generating the control signal according to the selection signal to control the coupled switch.

5. The voltage detection apparatus of claim 2, wherein the control signal having a magnitude and the magnitude being determined by the at least one voltage signal.

6. The voltage detection apparatus of claim 2, wherein each level shifter further comprising a power terminal and a level terminal, the power terminal being coupled to the positive electrode of a first cell in the coupled battery block for receiving a first voltage signal and the level terminal being coupled to the positive electrode of a second cell in the coupled battery block for receiving a second voltage signal.

7. The voltage detection apparatus of claim 6, wherein the first cell having a highest voltage potential in the coupled battery block.

8. The voltage detection apparatus of claim 2, wherein each switch further comprising a first terminal, a second terminal and a control terminal, the first terminal of each odd-numbered switch being connected to the positive electrode of one of the plurality of cells, the first terminal of each even-numbered switch being connected to the negative electrode of one of the plurality of cells, the second terminal of each odd-numbered switch being connected to a first node, the second terminal of each even-numbered switch being connected to a second node, and the control terminal of each switch receiving the control signal.

9. The voltage detection apparatus of claim 8, wherein a voltage difference between the first node and the second node being the cell voltage of the predetermined cell.

10. The voltage detection apparatus of claim 2, wherein one of the plurality of switches being a P-MOSFET and a bulk of the P-MOSFET being connected to a highest voltage potential in the coupled battery block.

11. The voltage detection apparatus of claim 2, wherein the switch box further supplying a common mode voltage to the detector buffer for calibrating the voltage value indicative of the cell voltage of the predetermined cell.

12. The voltage detection apparatus of claim 11, wherein the common mode voltage being acquired when a voltage at a predetermined electrode of the predetermined cell being passed to both the non-inverting terminal and the inverting terminal of the detector buffer through the switch box.

13. A method for detecting a voltage of each cell in a battery pack, the battery pack having a plurality of cells connected in series, comprising the steps of:
   predetermining a cell to be detected in response to a selection signal;
   receiving at least one voltage signal from the battery pack;
   generating a plurality of control signals according to the selection signal and the at least one voltage signal;
   selecting the predetermined cell under control of the plurality of control signals, the predetermined cell having a cell voltage;
   acquiring an intermediate voltage based on the cell voltage of the predetermined cell; and
   acquiring a voltage value indicative of the cell voltage of the predetermined cell according to the intermediate voltage.

14. The method of claim 13, further comprising the step of converting the intermediate voltage from analog to digital before acquiring the voltage value indicative of the cell voltage of the predetermined cell.

15. The method of claim 13, wherein each control signal having a magnitude determined by the selection signal and the at least one voltage signal.

16. The method of claim 13, wherein the step of selecting the predetermined cell further comprising the steps of:
supplying the plurality of control signals to a plurality of switches; and
turning on the switches that are coupled to the predetermined cell under control of the plurality of control signals.

17. The method of claim 13, further comprising the steps of:
providing a common mode voltage; and
calibrating the voltage value indicative of the cell voltage of the predetermined cell based on the common mode voltage.

18. The method of claim 17, wherein the step of providing the common mode voltage further comprising the steps of:
applying a voltage at a predetermined electrode of the predetermined cell to the inverting terminal and the non-inverting terminal of a detector buffer.

19. An electronic system, comprising:
a battery pack having a plurality of cells connected in series, the plurality of battery cells being divided into a plurality of battery blocks;
an electronic equipment attached to and powered up by the battery pack;
a digital device capable of predetermining a cell from the plurality of cells and providing selection signals; and
a voltage detection apparatus coupled to the digital device for receiving the selection signals and coupled to the battery pack for selecting the predetermined cell according to the selection signals and detecting a voltage of the predetermined cell, the voltage detection apparatus including a plurality of switch boxes and a plurality of switch controllers, each switch box being coupled to one of the plurality of battery blocks, and each switch controller being coupled to one of the plurality of battery blocks for receiving voltage signals and to one of the plurality of switch boxes for supplying control signals.

20. The electronic equipment system of claim 19, wherein the control signals determining a status of each switch box to select the predetermined cell.

21. The electronic equipment system of claim 19, wherein magnitudes of the control signals ensuring each switch box in normal operation.

22. The electronic equipment system of claim 21, wherein the voltage signals from the coupled battery block determining the magnitudes of the control signals.

* * * * *